United States Patent
Takano et al.

(10) Patent No.: US 6,797,452 B2
(45) Date of Patent: Sep. 28, 2004

(54) PHOTOSENSITIVE COMPOSITION COMPRISING PHOTOSENSITIVE SAPONIFIED POLY(VINYL ACETATE) AND PATTERN FORMATION METHOD MAKING USE OF THE COMPOSITION

(75) Inventors: Masahiro Takano, Chiba (JP); Shin Utsunomiya, Chiba (JP); Nobuji Sakai, Chiba (JP); Noriaki Tochizawa, Chiba (JP)

(73) Assignee: Toyo Gosei Kogyo Co., Ltd., Chiba (JP)

(*) Notice: Subject to any disclaimer, the term of this patent is extended or adjusted under 35 U.S.C. 154(b) by 0 days.

(21) Appl. No.: 10/198,657

(22) Filed: Jul. 12, 2002

(65) Prior Publication Data

US 2003/0022104 A1 Jan. 30, 2003

Related U.S. Application Data

(63) Continuation-in-part of application No. 09/588,131, filed on Jun. 2, 2000, now abandoned.

(30) Foreign Application Priority Data

Jun. 4, 1999 (JP) ............................................. 11-158071

(51) Int. Cl.[7] ........................ G03C 1/73; G03C 1/725; G03C 1/74; G03F 7/20; G03F 7/30
(52) U.S. Cl. ............................. 430/270.1; 430/271.1; 430/287.1; 430/325; 430/326; 430/905; 430/909
(58) Field of Search ........................ 430/270.1, 271.1, 430/287.1, 325, 326, 905, 909

(56) References Cited

U.S. PATENT DOCUMENTS 4,339,524 A * 7/1982 Ichimura et al. ......... 430/270.1

FOREIGN PATENT DOCUMENTS

| EP | 0779553 | 6/1997 | |
|---|---|---|---|
| EP | 0978764 | 2/2000 | |
| EP | 1058154 A1 * | 12/2000 | ............ G03F/7/038 |
| JP | 56761 | 2/1981 | |
| JP | 56762 | 2/1981 | |
| JP | 5611906 | 2/1981 | |
| JP | 5917550 | 1/1984 | |
| JP | 2276806 | 11/1990 | |
| JP | 643645 | 2/1994 | |

* cited by examiner

Primary Examiner—Mark F. Huff
Assistant Examiner—Sin J. Lee
(74) Attorney, Agent, or Firm—Huntley & Associates, LLC

(57) ABSTRACT

A photosensitive resin composition which includes a photosensitive saponified PVA having a pendant group derived from a quaternary styrylpyridinium or styrylquinolinium, or a derivative thereof. The composition comprises a photosensitive saponified PVA which has structural units represented by formulas (1) to (4):

$$-(CH_2-\underset{\underset{OH}{|}}{\overset{\overset{R^1}{|}}{C}})_k- \quad (1)$$

$$-(CH_2-\underset{\underset{OCOCH_3}{|}}{\overset{\overset{R^1}{|}}{C}})_l- \quad (2)$$

(3)
$$\begin{array}{c}R^1\diagdown\phantom{xx}CH_2\phantom{xx}\diagup R^1\\-\!\!\!\!-C\phantom{xxxxxxxxx}C\!-\!(CH_2)_m\!-\!\\ O\diagdown\phantom{x}\diagup O\\CH\\|\\[(CH_2)_p\!-\!O]_q\\|\\R^3\!-\!\!\!\!-\text{Ar}\\\phantom{xxx}\|\\\phantom{xxx}CH\\\phantom{xxx}\|\\HC\\\phantom{xxx}|\\R^2\end{array}$$

(4)
$$\begin{array}{c}R^1\diagdown\phantom{xx}CH_2\phantom{xx}\diagup R^1\\-\!\!\!\!-C\phantom{xxxxxxxxx}C\!-\!(CH_2)_n\!-\!\\ O\diagdown\phantom{x}\diagup O\\CH\\|\\R^4\end{array}$$

which product is dissolved in at least one organic solvent selected from the group consisting of compounds represented by formulas (5), (6), and (7).

$$R^5-(OCH_2CH_2)_s-OR^6 \quad (5)$$

$$R^7-(OCH_2CH_2CH_2)_t-OR^8 \quad (6)$$

$$R^7-(OCH_2\underset{\underset{}{|}}{\overset{\overset{CH_3}{|}}{CH}})_u-OR^8 \quad (7)$$

The resin composition can be dissolved in a comparatively safe high-boiling-point solvent, such as propylene glycol, and can be developed with water.

10 Claims, No Drawings

PHOTOSENSITIVE COMPOSITION COMPRISING PHOTOSENSITIVE SAPONIFIED POLY(VINYL ACETATE) AND PATTERN FORMATION METHOD MAKING USE OF THE COMPOSITION

CROSS-REFERENCE TO RELATED APPLICATION

This application is a Continuation-in-Part of application Ser. No. 09/588,131, filed Jun. 2, 2000 now abandoned.

BACKGROUND OF THE INVENTION

1. Field of the Invention

The present invention relates to a photosensitive resin composition comprising a photosensitive saponified poly (vinyl acetate), and to a pattern formation method making use of the composition. More particularly, the invention relates to a photosensitive resin composition which comprises a photosensitive saponified poly(vinyl acetate) dissolved in a high-boiling-point solvent having comparatively low toxicity, such as propylene glycol; which can be developed with water; has high photosensitivity; exhibits strong adhesion to a substrate; and has excellent patterning characteristics, and to a pattern formation method making use of the composition.

2. Background Art

Conventionally, a saponified poly(vinyl acetate) (hereinafter abbreviated as PVA)-base photosensitive resins having a pendant group derived from a styryl derivative having a quaternary aromatic azo-heterocyclic ring, which are disclosed in, for example, Japanese Patent Publication (kokoku) Nos. 56-5761, 56-5762, and 2-276806 and Japanese Patent Application Laid-Open (kokai) Nos. 56-11906, 59-17550, and 6-43645, are known to be water-soluble. These photosensitive resins are employed in practice as photosensitive materials for producing screen printing stencils, materials for making printing plates, materials for immobilization of biocatalysts, materials for manufacturing electronics, and other materials.

Quaternary styrylpyridinium or styrylquinolinium compounds are one of a rare type of photosensitive materials which undergo photo-dimerization via a singlet state, and advantageously, these compounds are not prone to inhibition by oxygen.

However, when a photosensitive resin having a styrylpyridinium or styrylquinolinium group or a derivative thereof is dissolved in an aqueous solvent and the solution is mixed with a material such as an inorganic material to thereby prepare a paste, the paste becomes dry when coated to a substrate through screen printing plate, thereby disrupting repeated printing. In addition, since film formed through such printing is easily dried, the paste exhibits poor smoothness and defoaming characteristics, thereby failing to provide a coating film of uniform thickness.

Furthermore, photosensitive resins having a styrylpyridinium or styrylquinolinium group or derivatives thereof can be dissolved in a highly polar solvent such as dimethylsulfoxide. However, these kinds of solvents are highly toxic, have bad odor and corrosive properties, and cannot be employed in some operation steps.

In contrast, PVA having a low saponification degree can be dissolved in certain organic solvents, but cannot be developed with water.

In view of the foregoing, an object of the present invention is to provide a photosensitive resin composition comprising a photosensitive saponified PVA which has a pendant group derived from a quaternary styrylpyridinium or styrylquinolinium compound or a derivative thereof and which can be dissolved in a relatively safe solvent of high boiling point such as propylene glycol, which composition can also be developed with water. Another object of the invention is to provide a pattern formation method making use of the composition.

SUMMARY OF THE INVENTION

The present inventors have conducted earnest studies in order to solve the aforementioned drawbacks, and have found that even when a hydrophobic group is introduced at a specific ratio into a photosensitive saponified PVA having a quaternary styrylpyridinium or styrylquinolinium moiety or a derivative thereof so as to enhance the hydrophobicity thereof such that the thus-modified resin or derivative can be dissolved in a high-boiling-point organic solvent such as propylene glycol, the resin or derivative can be developed with water without deterioration of properties such as excellent photosensitivity and adhesion. The present invention has been accomplished on the basis of this finding.

Accordingly, in a first aspect of the present invention, there is provided a photosensitive composition comprising a photosensitive saponified PVA, which composition comprises a saponified PVA having the structural units represented by formulas (1) to (4):

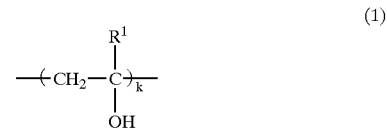

(1)

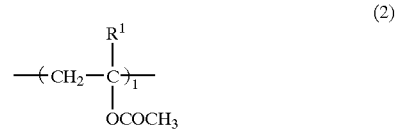

(2)

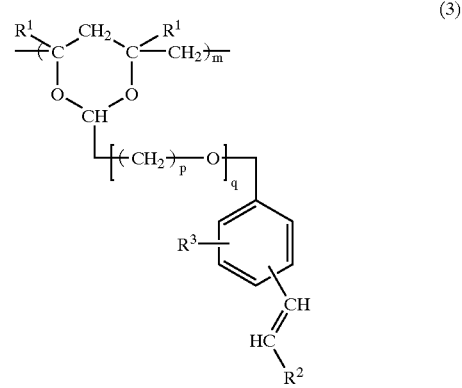

(3)

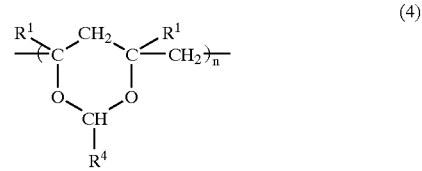

(4)

wherein each of k, l, m, and n is an arbitrary natural number; l may be 0; (k+l+m/2+n/2)=200–4500; $R^1$ represents a hydrogen atom or a methyl group; $R^3$ represents a hydrogen atom, an alkyl group, or an alkoxy group; $R^4$ represents a hydrogen atom, a C1–C8 aliphatic hydrocarbon group, an aryl group, an aralkyl group, or a heterocyclic group; p is an integer of 1–6; q is 0 or 1; and $R^2$ represents at least one species selected from the groups represented by formulas (8), (9), (10), and (11):

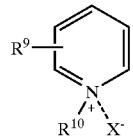

(8)

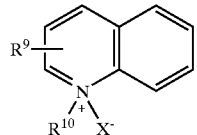

(9)

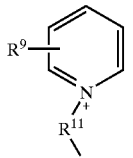

(10)

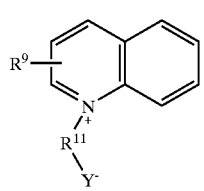

(11)

wherein $R^9$ represents a hydrogen atom, an alkyl group, or an alkoxy group; $R^{10}$ is a member selected from the group consisting of a hydrogen atom, alkyl groups, aralkyl groups, and combinations thereof; wherein the alkyl group and the aralkyl group may or may not contain one or more members of the group consisting of a hydroxyl group, a carbamoyl group, an ether bond, an ester bond, and an unsaturated bond; $R^{11}$ represents an alkylene group; $X^-$ represents a conjugate base; and $Y^-$ represents $SO_3^-$ or $CO_2^-$;

and at least one organic solvent selected from the group consisting of compounds represented by formulas (5), (6), and (7):

(5)

(6)

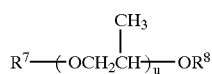

(7)

wherein each of $R^5$ and $R^6$ represents a hydrogen atom, a methyl group, an ethyl group, or an acetyl group; each of $R^7$ and $R^8$ represents a hydrogen atom, a methyl group, or an ethyl group; s is 1–4; and each of t and u is 1 or 2;
wherein the photosensitive saponified PVA is dissolved in the organic solvent.

Preferably, in formulas (1) to (4), (k+l+m/2+n/2) is 300–3,000, and the ratio of l to (k+l+m/2+n/2) is 50% or less.

Preferably, in formulas (1) to (4), the ratio of m to (k+l+m/2+n/2) is 0.5–5% and the ratio of n to (k+l+m/2+n/2) is 3–25%.

Preferably, in formula (4), $R^4$ is a C2–C5 aliphatic hydrocarbon group.

The photosensitive composition comprising a photosensitive saponified PVA may further contain at least one of an inorganic powder and an organic powder, the powder being dispersed in the composition.

In a second aspect of the present invention, there is provided a pattern formation method which comprises applying to a substrate the photosensitive composition as recited in the first aspect; drying the formed layer; exposing the layer patternwise; and developing by use of a developer predominantly containing water.

Preferably, the photosensitive composition is applied to a substrate through screen printing or blade coating.

DETAILED DESCRIPTION OF PREFERRED EMBODIMENTS

In the photosensitive resin composition of the present invention, an organic solvent represented by the aforementioned formula (5), (6), or (7) is preferably employed. These solvents may be used in combination of two or more species. Examples of organic solvents include ethylene glycols such as ethylene glycol, diethylene glycol, triethylene glycol, and tetraethylene glycol; glycol ethers such as ethylene glycol monomethyl ether, ethylene glycol monoethyl ether, diethylene glycol monomethyl ether, diethylene glycol monoethyl ether, ethylene glycol dimethyl ether, ethylene glycol diethyl ether, and diethylene glycol dimethyl ether; glycol ether acetates such as ethylene glycol monomethyl ether acetate, ethylene glycol monoethyl ether acetate, diethylene glycol monomethyl ether acetate, and diethylene glycol monoethyl ether acetate; propylene glycols such as propylene glycol and dipropylene glycol; and propylene glycol ethers such as propylene glycol monomethyl ether, propylene glycol monoethyl ether, dipropylene glycol monomethyl ether, dipropylene glycol monoethyl ether, propylene glycol dimethyl ether, propylene glycol diethyl ether, dipropylene glycol dimethyl ether, and dipropylene glycol diethyl ether.

Among the aforementioned organic solvents, propylene glycol, dipropylene glycol, and their derivatives are particularly preferred in view of effects to the human body and solubility.

In addition, another solvent may be added to the solvent in an amount within a range where the solubility of the photosensitive resin of the present invention is not impaired. Water may be used in combination when no practical problem arises. However, it is preferred that the present compositions be substantially free of water. This permits the compositions to be used in screen printing. The presence of water interferes with screen printing by plugging a screen printing plate.

In the present invention, the sum (k+l+m/2+n/2) in formulas (1) to (4) is preferably 200–4,500, more preferably 300–3,000. When the sum is less than 200, a photocured film has poor mechanical strength, generating pattern failure during development, whereas when the sum is in excess of 4,500, gelation induced by formation of hydrogen bonds readily occurs in a composition comprising the photosensitive saponified PVA.

The ratio of l to (k+l+m/2+n/2) in formulas (1) to (4) is preferably 50% or less. When l is in excess of 50, water developability decreases and residue remains in unexposed portions.

In the present invention, the ratio of m to (k+l+m/2+n/2) in formulas (1) to (4) is preferably 0.5–5%, more preferably 0.8–4%. When m is less than 0.5%, photosensitivity is poor, whereas when m is in excess of 5%, water developability decreases.

Preferably, in formulas (1) to (4), the ratio of n to (k+l+m/2+n/2) is 3–25%. When the ratio is less than 3%, the hydrophobicity of the polymer is poor and gelation readily occurs in a composition comprising the photosensitive saponified PVA, whereas when the ratio is in excess of 25%, residue remains in unexposed portions and adhesion of a composition comprising the product to a substrate decreases. Furthermore, $R^4$ in formula (4) is preferably a C2–C5 aliphatic hydrocarbon group, since such a group imparts appropriate hydrophobicity to the photosensitive saponified PVA.

The photosensitive composition of the present invention is prepared through the following method. Specifically, an aldehyde or acetal derivative of a quaternary styrylpyridinium or styrylquinolinium, which derivative is represented by formula (12) or (13):

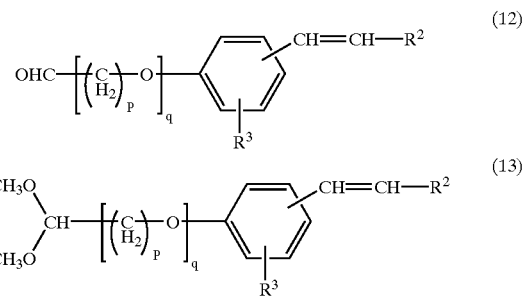

wherein each of $R^2$ and $R^3$ has the same meaning as defined in the above formula (3); or an aldehyde or an acetal derivative thereof for forming a unit represented by formula (4) are introduced to a saponified PVA in an aqueous medium or a water-organic solvent mixture. After the reaction mixture is dehydrated, the resultant matter is dissolved, to the thereby prepared the composition. Dehydration may be carried out through distillation, distillation under reduced pressure, or azeotropic dehydration. These methods may be employed in combination. Alternatively, a polymer synthesized in an aqueous medium is poured into a poor solvent so as to recover the polymer, which is then dissolved in an organic solvent.

The aforementioned saponified PVA may be modified so as to adjust developability and enhance mechanical properties of a resist obtained therefrom. Examples of modified products which can be employed include a copolymer thereof with another vinyl monomer, a hydrophilic group-modified product, an oleophilic group-modified product, a terminal-end-modified product, a cation-modified product, and an anion-modified product.

Examples of compounds which are introduced in the saponified PVA so as to form a unit represented by formula (4) include C1–C9 aliphatic saturated aldehydes such as formaldehyde, acetaldehyde, propionaldehyde, n-butyl aldehyde, isobutyl aldehyde, valeraldehyde, isovaleraldehyde, pivalic aldehyde, caproic aldehyde, and heptaldehyde; C1–C9 aliphatic unsaturated aldehydes such as acrolein, crotonaldehyde, and propiolaldehyde; aromatic aldehydes such as benzaldehyde, o-tolualdehyde, m-tolualdehyde, and p-tolualdehyde; heterocyclic aldehydes such as furfural; and acetal compounds thereof. These compounds may be used singly or in combination of two or more species.

Examples of catalysts employed for acetalization include inorganic acids such as hydrochloric acid, sulfuric acid, phosphoric acid, and nitric acid; organic acids such as oxalic acid, methanesulfonic acid, and dodecylbenzenesulfonic acid; and acidic ion-exchange resins. Then, inorganic acids may be neutralized or acidic ion-change resins may be removed.

During preparation of the composition, an aldehyde or acetal derivative of a quaternary styrylpyridinium or styrylquinolinium and an aldehyde or an acetal derivative thereof for forming a unit represented by formula (4) may be added simultaneously or separately. Preferably, these two components are added with a time interval, since the aldehyde or an acetal derivative thereof for forming a unit represented by formula (4) may inhibit introduction of the aldehyde or acetal derivative of a quaternary styrylpyridinium or styrylquinolinium.

Examples of solvents employed for azeotropic dehydration include aliphatic hydrocarbons such as hexane, heptane, octane, cyclohexane, and methylcyclohexane; and aromatic hydrocarbons such as benzene, toluene, and xylene.

Alternatively, an aldehyde or an acetal derivative thereof for forming a unit represented by formula (4) may be introduced to a saponified PVA to obtain a polymer having hydrophobicy, the polymer solubilized in an organic solvent, and then the quaternary portion is added to the polymer to obtain the photosensitive saponified PVA.

A variety of powders of inorganic material, such as phosphors, glass, oxides, and inorganic conductors, may be dispersed in the photosensitive composition of the present invention. Examples of phosphors include ZnO:Zn, $Zn_3(PO_4)_2$:Mn, $Y_2SiO_5$:Ce, $CaWO_4$:Pb, $BaMgAl_{14}O_{23}$:Eu, ZnS:(Ag, Cd), $Y_2O_3$:Eu, $Y_2SiO_5$:Eu, $Y_3Al_5O_{12}$:Eu, $YBO_3$:Eu, (Y, Gd)$BO_3$:Eu, $GdBO_3$:Eu, $ScBO_3$:Eu, $LuBO_3$:Eu, $Zn_2SiO_4$:Mn, $BaAl_{12}O_{19}$:Mn, $SrAl_{13}O_{19}$:Mn, $CaAl_{12}O_{19}$:Mn, $YBO_3$:Tb, $BaMgAl_{14}O_{23}$:Mn, $LuBO_3$:Tb, $GdBO_3$:Tb, $ScBO_3$:Tb, $Sr_6Si_3O_3Cl_4$:Eu, ZnS:(Cu, Al), ZnS:Ag, $Y_2O_2S$:Eu, ZnS:Zn, (Y, Cd)$BO_3$:Eu, and $BaMgAl_{10}O_{17}$:Eu. Examples of glass (powder form) include lead borosilicate glass, zinc borosilicate glass, and bismuth borosilicate glass; e.g., PbO—$SiO_2$, PbO—$B_2O_3$—$SiO_2$, ZnO—$SiO_2$, ZnO—$B_2O_3$—$SiO_2$, BiO—$SiO_2$, and BiO—$B_2O_3$—$SiO_2$. Examples of oxides include oxides of metals such as Na, K, Mg, Ca, Ba, Ti, Zr, and Al; e.g., cobalt oxide, iron oxide, chromium oxide, nickel oxide, copper oxide, manganese oxide, neodymium oxide, vanadium oxide, cerium oxide, Tipaque yellow, cadmium oxide, alumina, silica, magnesia, and spinel. Examples of inorganic conductors include iron, nickel, copper, aluminum, silver, and gold. These inorganic powders may be used singly or in combination of two or more species.

Powders of organic material may be dispersed in the photosensitive composition of the present invention. Examples of applicable organic materials include organic pigments of species such as azo, phthalocyanine, indigo, anthraquinone, perylene, perynone, dioxazine, quinacridone, isoindolinone, phthalone, or methine-azomethine.

These inorganic or organic powders are used singly or in combination, and preferably incorporated in an amount of 50–2,400 parts by weight into 100 parts by weight of the entire amount of photosensitive saponified PVA. When the amount is in excess of 2,400 parts by weight, photocurability of the composition decreases, possibly generating pattern failures, whereas when the amount is less than 50 parts by weight, the formed pattern may shrink during burning for removal of photosensitive organic material.

Other known additives, such as plasticizers, pigments, dyes, defoaming agents, coupling agents, and leveling agents, may optionally be incorporated into the photosensitive composition of the present invention.

The photosensitive composition of the present invention is applied as a solution or a paste. No particular limitation is imposed on the method for applying the composition, and a variety of coating methods such as screen printing, curtain coating, blade coating, spin coating, spray coating, dip coating, and slit coating may be employed.

The thus-applied solution or paste is dried and then exposed through a specific mask. The sensitization wavelength is 300–450 nm, and light sources such as a high-pressure mercury lamp, an arc lamp, a chemical lamp, a metal halide lamp, and a xenon lamp may be used. Finally, wet-developing of the exposed coating film forms a pattern.

Any developing method may be employed, such as development by means of a spray, paddles, or dipping. Particularly, development by means of a spray is preferred, in view of generation of a small amount of residue. Ultrasound may be applied if required.

The developer is preferably water; i.e., a neutral developer. Additives such as an organic solvent, a surfactant, and a defoaming agent may be added so as to enhance performance of the developer.

Examples of organic solvents which may be added to the developer include alcohols such as methanol, ethanol, 1-propanol, 2-propanol, 1-butanol, 2-butanol, and tert-butanol; glycols such as ethylene glycol, diethylene glycol, triethylene glycol, tetraethylene glycol, propylene glycol, dipropylene glycol, and trimethylene glycol; glycol ethers such as ethylene glycol monomethyl ether, ethylene glycol monoethyl ether, diethylene glycol monomethyl ether, diethylene glycol monoethyl ether, ethylene glycol dimethyl ether, ethylene glycol diethyl ether, diethylene glycol dimethyl ether, propylene glycol monomethyl ether, propylene glycol monoethyl ether, dipropylene glycol monomethyl ether, and dipropylene glycol monoethyl ether; N-methylpyrrolidone; N,N-dimethylformamide; and N,N-dimethylacetamide.

The organic solvents are preferably added in an amount of 100 parts by weight or less to 100 parts by weight of water, more preferably 20 parts by weight or less in consideration of non-hazardous operational circumstances.

Examples of surfactants which may be added to the developer include aliphatic carboxylic acid salts such as sodium laurate and sodium oleate; higher alcohol sulfate ester salts such as sodium lauryl sulfate and sodium castor oil sulfate; polyoxyethylene alkyl ether sulfate ester salts such as sodium polyoxyethylene lauryl ether sulfate and a polyoxyethylene lauryl ether sulfate triethanolamine salt; polyoxyethylene alkyl aryl ether sulfate ester salts such as sodium polyoxyethylene octylphenyl ether sulfate, a polyoxyethylene octylphenyl ether sulfate triethanolamine salt, and sodium polyoxyethylene nonylphenyl ether sulfate; alkyl diphenyl ether disulfonate salts; alkyl disulfonate salts; alkylarylsulfonate salts such as sodium dodecylbenzenesulfonate, sodium dibutylnaphthalenesulfonate, and sodium triisopropylnaphthalenesulfonate; higher alcohol phosphate ester salts such as dilauryl sodium phosphate; polyoxyethylene alkyl ether phosphate ester salts such as a polyoxyethylene lauryl ether phosphate monoester disodium salt and a polyoxyethylene lauryl ether phosphate diester monosodium salt; sorbitan fatty acid esters such as sorbitan monostearate, sorbitan monooleate, and sorbitan sesquioleate; polyoxyethylene sorbitan fatty acid esters such as polyoxyethylene sorbitan monolaurate, a polyoxyethylene sorbitan palm oil fatty acid monoester, and polyoxyethylene sorbitan monopalmitate; acetylene glycols; alkylbetaines such as lauryldimethylamino acid betaine; alkylimidazolines such as 2-alkyl-N-carboxymethyl-N-hydroxyethylimidazolinium betaine. These surfactants may be used singly or in combination of two or more species. The surfactants are preferably added in amounts of 0.01–15 parts by weight to 100 parts by weight of water, more preferably 0.01–10 parts by weight.

A variety of defoaming agents may be added to the developer in order to suppress forming during development. Examples include silicone resin defoaming agents such as silicone resin, fluorosilicone resin, and inorganic-powder-blended silicone resin; fats and oils such as castor oil, sesame oil, and linseed oil; higher fatty acids such as stearic acid, oleic acid, and palmitic acid; fatty acid esters such as isoamyl stearate, diglycol laurate, distearyl succinate, sorbitan monolaurate, polyoxyethylene sorbitan; polyoxyalkylene glycol; polyoxyalkylene glycol derivatives; alcohols such as methanol, ethanol, isopropanol, sec-butanol, n-butanol, 3-heptanol, 2-ethylhexanol, and di-tert-aminophenoxyethanol; ethers such as di-tert-aminophenoxyethanol, 3-heptyl cellosolve, and nonyl cellosolve-3-heptyl carbitol; phosphate esters such as tributyl phosphate, sodium octyl phosphate, and tris(butoxyethyl) phosphate; amines such as diamylamine; amides such as polyalkyleneamide, acylated polyamine, and dioctadecanoylpiperidine; metallic soaps such as Al-stearate, Ca-stearate, and K-oleate; and sulfonate esters such as Na-dodecylsulfonate and Na-laurylsulfonate. The above defoaming agent is preferably added in an amount of 0.01–10 wt. % to the entirety amount of the developer.

EXAMPLES

The present invention will next be described in detail by way of examples, which should not be construed as limiting the invention thereto.

Example 1

A vinyl acetate polymer (polymerization degree 600; saponification degree 70) (100 g) was dissolved in water (535 g), and to the solution, N-methyl-γ-(p-formylstyryl) pyridinium metosulfate (hereinafter referred to as SbQ) (23.3 g) and phosphoric acid (5 g) were added, followed by stirring at 30° C. for six hours. Subsequently, propylene glycol (267 g) and n-butyl aldehyde (10.4 g) were added to the reaction mixture, followed by further stirring at 30° C. for 14 hours.

Ion-exchange resin (Amberlyst IRA-45; product of Rohm & Haas Co.) (65 ml) was added to the solution, and the resultant mixture was stirred at 50° C. for four hours, to thereby neutralize the solution. The ion-exchange resin was removed from the mixture through filtration.

Subsequently, propylene glycol (628 g) and cyclohexane (50 g) were added to the filtrate, and the resultant mixture was subjected to azeotropic dehydration at 74° C. Cyclohexane was removed from the mixture through distillation at 81° C., to thereby obtain a photosensitive resin solution in propylene glycol.

The resin in the solution was analyzed through NMR spectrometry, and the results revealed that the amount of added SbQ was 2.7 mol % and that of added n-butyl aldehyde was 5.5 mol %.

The thus-obtained photosensitive resin solution was applied to a soda glass plate by means of a spin-coater and dried in a clean oven at 80° C. for 30 minutes, followed by cooling to room temperature. The coating was exposed to the ultraviolet light from an ultra-high-pressure mercury lamp having an illuminance of 5.0 mW/cm$^2$ for a dose of 50 mJ/cm$^2$, through a mask having a predetermined pattern.

Subsequently, the photocured resin was spray-developed with ion-exchange water for 30 seconds, to thereby obtain an objective pattern. The pattern had a film thickness of 5 μm and the sensitivity of the resin as evaluated on the basis of the UGRA step tablet was 10.

The photosensitive resin solution was stored at 40° C., and variation in patterning characteristic was evaluated. The results indicated that no variation in patterning characteristic was observed even after the solution had been stored for two weeks.

Example 2

A vinyl acetate polymer (polymerization degree 600; saponification degree 70) (100 g) was dissolved in water (388 g), and to the solution, N-methyl-γ-(p-formylstyryl) pyridinium metosulfate (15.9 g) and metanesulfonic acid (2 g) were added, followed by stirring at 30° C. for six hours. Subsequently, propylene glycol (259 g) and benzaldehyde (13.4 g) were added to the reaction mixture, followed by further stirring at 30° C. for 14 hours.

Ion-exchange resin (Amberlyst IRA-45; product of Rohm & Haas Co.) (36 ml) was added to the solution, and the resultant mixture was stirred at 50° C. for four hours, to thereby neutralize the solution. Then the ion-exchange resin was removed from the mixture through filtration.

Subsequently, propylene glycol (607 g) and cyclohexane (50 g) were added to the filtrate, and the resultant mixture was subjected to azeotropic dehydration at 74° C. Cyclohexane was removed from the mixture through distillation at 81° C., to thereby obtain a photosensitive resin solution in propylene glycol.

The resin in the solution was analyzed through NMR spectrometry, and the results revealed that the amount of added SbQ was 2.1 mol % and that of added n-benzaldehyde was 5.0 mol %.

The photosensitive resin solution was applied to a soda glass plate by means of a spin-coater and dried in a clean oven at 80° C. for 30 minutes, followed by cooling to room temperature. The coating was exposed to the ultraviolet light of an ultra-high-pressure mercury lamp having an illuminance of 5.0 mW/cm$^2$ for a dose of 50 mJ/cm$^2$, through a mask having a predetermined pattern. Subsequently, the photocured resin was spray-developed with ion-exchange water for 30 seconds, to thereby obtain an objective pattern. The pattern had a film thickness of 5 μm and the sensitivity of the resin as evaluated on the basis of the UGRA step tablet was 8.

The photosensitive resin solution was stored at 40° C., and variation in patterning characteristic was evaluated. The results indicated that no variation in patterning characteristic was observed even after the solution had been stored for two weeks.

Example 3

A vinyl acetate polymer (polymerization degree 1100; saponification degree 80) (100 g) was dissolved in water (676 g), and to the solution, N-methyl-γ-(p-formylstyryl) quinolinium metosulfate (hereinafter referred to as SQQ) (8.3 g) and oxalic acid (4 g) were added, followed by stirring at 30° C. for six hours. Propylene glycol (477 g) and n-butyl aldehyde (11.0 g) were then added to the reaction mixture, followed by further stirring at 30° C. for 14 hours.

Ion-exchange resin (Amberlyst IRA-45; product of Rohm & Haas Co.) (52 ml) was added to the solution, and the resultant mixture was stirred at 50° C. for four hours, to thereby neutralize the solution. Then the ion-exchange resin was removed from the mixture through filtration.

Subsequently, propylene glycol (321 g) and cyclohexane (50 g) were added to the filtrate, and the resultant mixture was subjected to azeotropic dehydration at 74° C. Cyclohexane was removed from the mixture through distillation at 81° C., to thereby obtain a photosensitive resin solution in propylene glycol.

The resin in the solution was analyzed through NMR spectrometry, and the results revealed that the amount of added SQQ was 0.65 mol % and that of added n-butyl aldehyde was 7.2 mol %.

The photosensitive resin solution was applied to a soda glass plate by means of a spin-coater and dried in a clean oven at 80° C. for 30 minutes, followed by cooling to room temperature. The coating was exposed to the ultraviolet light of an ultra-high-pressure mercury lamp having an illuminance of 5.0 mW/cm$^2$ for a dose of 30 mJ/cm$^2$, through a mask having a predetermined pattern. Subsequently, the photocured resin was spray-developed with ion-exchange water for 30 seconds, to thereby obtain an objective pattern. The pattern had a film thickness of 5 μm and the sensitivity of the resin as evaluated on the basis of the UGRA step tablet was 10.

The photosensitive resin solution was stored at 40° C., and variation in patterning characteristic was evaluated. The results indicated that no variation in patterning characteristic was observed even after the solution had been stored for two weeks.

Example 4

A vinyl acetate polymer (polymerization degree 2300; saponification degree 88) (100 g) was dissolved in water (713 g), and to the solution, N-methyl-γ-(p-formylstyryl) pyridinium metosulfate (SbQ) (11.7 g) and methanesulfonic acid (2 g) were added, followed by stirring at 30° C. for six hours. Propylene glycol (441 g) and propionaldehyde (14.2 g) were then added to the reaction mixture, followed by further stirring at 30° C. for 14 hours.

Ion-exchange resin (Amberlyst IRA-45; product of Rohm & Haas Co.) (26 ml) was added to the solution, and the resultant mixture was stirred at 50° C. for four hours, to thereby neutralize the solution. Then the ion-exchange resin was removed from the mixture through filtration.

Subsequently, propylene glycol (1007 g) and cyclohexane (70 g) were added to the filtrate, and the resultant mixture was subjected to azeotropic dehydration at 74° C. Cyclohexane was removed from the mixture through distillation at 81° C., to thereby obtain a photosensitive resin solution in propylene glycol.

The thus-obtained resin was analyzed through NMR spectrometry, and the results revealed that the amount of added SbQ was 1.4 mol % and that of added propionaldehyde was 10.3 mol %.

The photosensitive resin solution was applied to a soda glass plate by means of a spin-coater and dried in a clean oven at 80° C. for 30 minutes, followed by cooling to room temperature. The coating was exposed to the ultraviolet light of an ultra-high-pressure mercury lamp having an illuminance of 5.0 mW/cm$^2$ for a dose of 30 mJ/cm$^2$ through a mask provided with a predetermined pattern. Subsequently, the photocured resin was spray-developed with ion-exchange water for 30 seconds, to thereby obtain an objective pattern. The pattern had a film thickness of 5 μm and the sensitivity of the resin as evaluated on the basis of the UGRA step tablet was 10.

The photosensitive resin solution was stored at 40° C., and variation in patterning characteristic was evaluated. The results indicated that no variation in patterning characteristic was observed even after the solution had been stored for two weeks.

Comparative Example

A vinyl acetate polymer (polymerization degree 600; saponification degree 70) (100 g) was dissolved in water (535 g), and to the solution, SbQ (23.3 g) and phosphoric acid (5 g) were added, followed by stirring at 30° C. for six hours. Propylene glycol (267 g) was then added to the reaction mixture, followed by further stirring at 30° C. for 14 hours.

Ion-exchange resin (Amberlyst IRA-45; product of Rohm & Haas Co.) (36 ml) was added to the solution, and the resultant mixture was stirred at 50° C. for four hours, to thereby neutralize the solution. Then, the ion-exchange resin was removed from the mixture through filtration.

Subsequently, propylene glycol (558 g) and cyclohexane (50 g) were added to the filtrate. The resultant mixture was subjected to azeotropic dehydration, and cyclohexane was removed from the mixture through distillation, to thereby form a gelled solution instead of a uniform solution.

As described hereinabove, the photosensitive resin which is employed in the present invention has high safety, since the resin can be dissolved in a comparatively safe high-boiling-point solvent, such as propylene glycol, and can be developed with water. In addition, the resin exhibits strong adhesion to a substrate and has excellent patterning characteristics, and thus the resin or a composition containing the resin is of great industrial value and can be practically and widely used.

What is claimed is:

1. A photosensitive composition comprising a photosensitive saponified poly(vinyl acetate) which composition is dehydrated and comprises a saponified poly(vinyl acetate) (PVA) having the structural units represented by formulas (1) to (4):

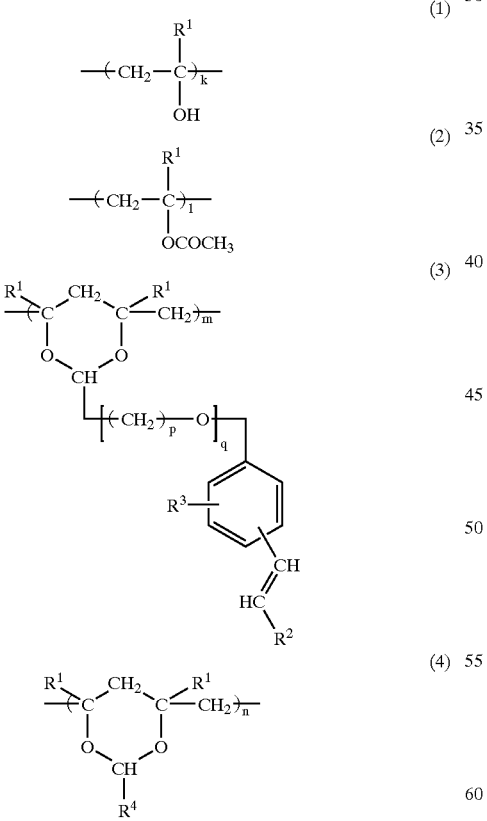

wherein each of k, l, m, and n is an arbitrary natural number; l may be 0; $(k+l+m/2+n/2)=200-4500$; $R^1$ represents a hydrogen atom or a methyl group; $R^3$ represents a hydrogen atom, an alkyl group, or an alkoxy group; $R^4$ represents a hydrogen atom, a C1–C8 aliphatic hydrocarbon group, an aryl group, an aralkyl group, or a heterocyclic group; p is an integer of 1–6; q is 0 or 1; and $R^2$ represents at least one species selected from the groups represented by formulas (8), (9), (10), and (11):

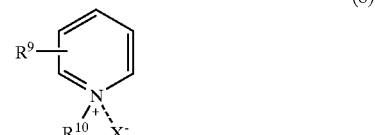

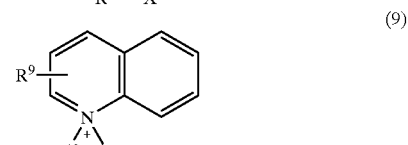

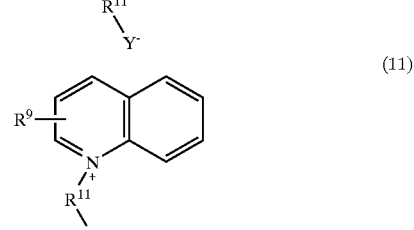

wherein $R^9$ represents a hydrogen atom, an alkyl group, or an alkoxy group; $R^{10}$ is a member selected from the group consisting of a hydrogen atom, alkyl groups, aralkyl groups, and combinations thereof; the alkyl group being selected from among those including at least one member of the group consisting of a hydroxyl group, a carbamoyl group, an ether bond, an ester bond, and an unsaturated bond, and the aralkyl group being selected from among those having no such group; $R^{11}$ represents an alkylene group; $X^-$ represents a conjugate base; and $Y^-$ represents $SO_3^-$ or $CO_2^-$;

and at least one organic solvent selected from the group consisting of compounds represented by formulas (5), (6), and (7);

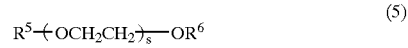

wherein each of $R^5$ and $R^6$ represents a hydrogen atom, a methyl group, an ethyl group, or an acetyl group; each of $R^7$ and $R^8$ represents a hydrogen atom, a methyl group, or an ethyl group; s is 1–4; and each of t and u is 1 or 2, wherein the photosensitive saponified PVA is dissolved in the organic solvent.

2. A photosensitive composition according to claim 1, wherein, in formulas (1) to (4), $(k+l+m/2+n/2)$ is 300–3,000, and the ratio of l to $(k+l+m/2+n/2)$ is 50% or less.

3. A photosensitive composition according to claim 1, wherein, in formulas (1) to (4), the ratio of m to (k+l+m/

2+n/2) is 0.5–5% and the ratio of n to (k+l+m/2+n/2) is 3–25%.

4. A photosensitive composition according to claim 1, wherein, in formula (4), $R^4$ is a C2–C5 aliphatic hydrocarbon group.

5. A photosensitive composition according to claim 1, which further contains at least one of an inorganic powder and an organic powder, the powder being dispersed in the composition.

6. A pattern formation method which comprises applying to a substrate a photosensitive composition as recited in claim 1; drying the formed layer, exposing the layer patternwise; and developing by use of a developer predominantly containing water.

7. A pattern formation method according to claim 6, wherein, in formulas (1) to (4), (k+l+m/2+n/2) is 300–3,000, and the ratio of l to (k+l+m/2+n/2) is 50% or less.

8. A pattern formation method according to claim 6, wherein, in formulas (1) to (4), the ratio of m to (k+l+m/2+n/2) is 0.5–5% and the ratio of n to (k+l+m/2+n/2) is 3–25%.

9. A pattern formation method according to claim 6, wherein, in formula (4), $R^4$ is a C2–C5 aliphatic hydrocarbon group.

10. A pattern formation method which comprises applying to a substrate a photosensitive composition as recited in claim 1 through screen printing or blade coating.

* * * * *